(12) United States Patent
Cho

(10) Patent No.: US 8,105,939 B2
(45) Date of Patent: Jan. 31, 2012

(54) LDMOS TRANSISTOR AND METHOD FOR MANUFACTURING THE SAME

(75) Inventor: Cheol Ho Cho, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 177 days.

(21) Appl. No.: 12/614,768

(22) Filed: Nov. 9, 2009

(65) Prior Publication Data

US 2010/0123196 A1   May 20, 2010

(30) Foreign Application Priority Data

Nov. 17, 2008   (KR) .................. 10-2008-0113894

(51) Int. Cl.
*H01L 21/4763* (2006.01)
(52) U.S. Cl. . 438/637; 257/343; 257/774; 257/E21.575; 257/E29.261; 257/E23.01
(58) Field of Classification Search .................. 438/637; 257/343, 774, E21.575, E29.261, E23.01
See application file for complete search history.

(56) References Cited

U.S. PATENT DOCUMENTS

2003/0013284 A1* 1/2003 Emrick et al. ................. 438/575

FOREIGN PATENT DOCUMENTS

| KR | 2001-0084644 A | 9/2001 |
|---|---|---|
| KR | 10-2004-0008901 A | 1/2004 |

OTHER PUBLICATIONS

Hyeong Jong Lee; "Method for Forming Metal Interconnection of Semiconductor Device"; Korea Patent Abstracts; Publication No. 1020040008901 A; Publication Date: Jan. 31, 2004; Korean Intellectual Property Office, Republic of Korea.
Dong Seok Kim; "Semiconductor Device and Method of Manufacturing the Same"; Korea Patent Abstracts; Publication No. 1020010084644 A; Publication Date: Sep. 6, 2001; Korean Intellectual Property Office, Republic of Korea.
Korean Office Action dated Aug. 31, 2010; Korean Patent Application No. 10-2008-0113894; pp. 4; Korean Intellectual Property Office, Republic of Korea.

* cited by examiner

*Primary Examiner* — Marcos D. Pizarro
*Assistant Examiner* — Eva Yan Montalvo
(74) *Attorney, Agent, or Firm* — The Law Offices of Andrew D. Fortney; Andrew D. Fortney; Bradley J. Levang

(57) ABSTRACT

A LDMOS transistor and a method for manufacturing the same are disclosed. A lateral double diffused metal oxide semiconductor (LDMOS) transistor includes a first dielectric layer formed on a top surface of a substrate; a plurality of second dielectric layers on a top surface of the first dielectric layer; a plurality of contact plugs spaced apart by a predetermined distance in an active region of the substrate, passing through the first and second dielectric layers; and a bridge metal line formed in the second dielectric layers, inter-connecting the contact plugs in a horizontal direction. The bridge metal line formed to inter-connect the contact plugs allows for more current to flow in the presently disclosed LDMOS transistor than in a conventional LDMOS transistor of identical size.

9 Claims, 5 Drawing Sheets

LDMOS TRANSISTOR AND METHOD FOR MANUFACTURING THE SAME

CROSS REFERENCE TO RELATED APPLICATION

This application claims the benefit of Korean Patent Application No. 10-2008-0113894, filed on Nov. 17, 2008, which is hereby incorporated by reference as if fully set forth herein.

BACKGROUND OF THE DISCLOSURE

1. Field of the Disclosure

The present invention relates to a semiconductor device and a method for manufacturing the same. More particularly, the present invention relates to a lateral double diffused metal oxide semiconductor (LDMOS) device and a method for manufacturing the same.

2. Discussion of the Related Art

As follows, a conventional lateral double diffused metal oxide semiconductor (LDMOS) transistor will be described in reference to corresponding drawings.

FIG. 1 is an overhead view illustrating a conventional LDMOS transistor.

In reference to FIG. 1, at least one metal line 20 and a contact 22 are formed and a dielectric layer 10 is formed between the metal lines 20.

FIG. 2 is a cross-sectional view illustrating the LDMOS transistor cut away along line A-A' shown in FIG. 1. FIG. 3 is a cross-sectional view illustrating the LDMOS transistor of FIG. 1 cut away along line B-B' shown in FIG. 1.

In reference to FIGS. 1 and 2, an n-type well 38 is formed in an n-type substrate 30 having an active region defined by an isolation layer 36. A p-type body region 60 and n-type extended drain regions 32 and 40 are spaced apart by a predetermined distance within the n-type well 38. An $n^+$-type source region 62 is formed in a predetermined top surface area of the substrate, adjacent to the p-type body region 60. A channel region of the LDMOS transistor lies below the gate dielectric layer 72 and gate conductivity layer 70, formed thereover. Two $n^+$-type drain regions 34 and 42 are formed in substrate 30, adjacent to the n-type extended drain regions 32 and 40, respectively. A gate spacer layer 76 is formed on a side wall of the gate conductivity layer 70. The space layer 76 may be formed of two dielectric layers 72 and 74. Although not shown in the drawings specifically, a first ion implantation is performed before forming the gate spacer layer 76 to form the p type region 60. After forming the gate spacer layer 76, second ion implantation is performed to form n+ type source and drain regions 42, 62, and 34. Silicide layers 50 are then formed over the drain regions 34 and 42, the source region 62, and the gate conductivity layer 70. As a result, a completed LDMOS transistor structure is formed, as shown in FIG. 2.

Dielectric layers 80, 82, 84, 90, 92, 94, 96, 100 and 102 are formed over the LDMOS transistor structure described above. Contact plugs 22 are formed within the dielectric layers. As shown in FIG. 2, each of the contact plugs is in contact with a corresponding metal line, e.g., metal lines 91, 93 and 98. Contact holes (not shown) are formed in the dielectric layers prior to depositing the contact plugs 22. Also, a contact barrier layer 24 is formed in the contact holes prior to forming the contact plugs 22, and is in contact with the dielectric layers and the silicide layers 50. As shown in FIGS. 2-3, the contact barrier layer 24 is on an outer surface of the contact plugs 22, and is thus interposed between the contact plugs 22 and the dielectric layers and silicide layers 50.

The above LDMOS transistor includes as many contact plugs as possible having minimum design rules to enable the delivery of operation voltages and currents in a substantially short time period. The large number of the contact plugs is advantageous to have a transistor that can deliver many currents simultaneously in a highly limited space. As transistor devices become increasingly miniaturized, the space in which contact plugs are formed is progressively limited. The present invention is directed toward providing an improved contact plug structure that enables miniaturization of ultra large scale integration (ULSI) era transistors.

SUMMARY OF THE DISCLOSURE

Accordingly, the present invention is directed to a LDMOS transistor and a method for manufacturing the same.

An object of the present invention is to provide a LDMOS transistor that is able to flow as much current as possible with a predetermined number of contact plugs and a predetermined size of a transistor and a method for manufacturing the LDMOS transistor.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a lateral double diffused metal oxide semiconductor (LDMOS) transistor includes a first dielectric layer formed on or over a top surface of a substrate; a plurality of second dielectric layers in a multi-layered dielectric structure on or over a top surface of the first dielectric layer; a plurality of contact plugs spaced apart a predetermined distance from each other in an active region, within the first and second dielectric layers; and a bridge metal line formed in the second dielectric layers, inter-connecting the spaced contact plugs in a horizontal direction.

In another aspect of the present invention, a method for manufacturing a LDMOS transistor includes forming a first dielectric layer on or over a top surface of a substrate; forming a plurality of second dielectric layers having different dopant densities on or over a top surface of the first dielectric layer sequentially; etching the first and second dielectric layers to form a plurality of contact holes to expose a plurality of contact regions spaced apart from each other by a predetermined distance; forming a horizontal bridge metal line region passing through one of the second dielectric layers, which has a lower dopant density than the other second dielectric layers; and forming a plurality of contact plugs spaced apart by a predetermined distance and bridge metal lines connecting the plurality of contact plugs by depositing a metal in the open contact regions and the horizontal bridge metal line region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure constitute a part of this application, illustrate embodiment(s) of the disclosure, and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

As follows, a LDMOS transistor according to an exemplary embodiment will be described in reference to the accompanying drawings.

Figure 1:
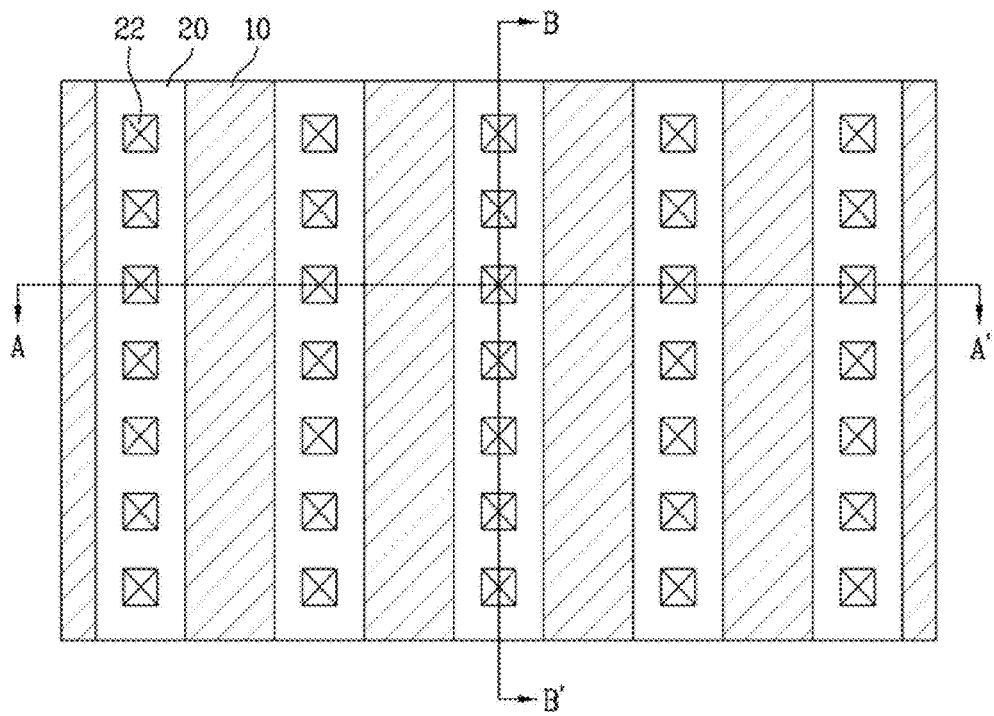
FIG. 1 is an overhead view illustrating a conventional LDMOS transistor.
Figure 4:
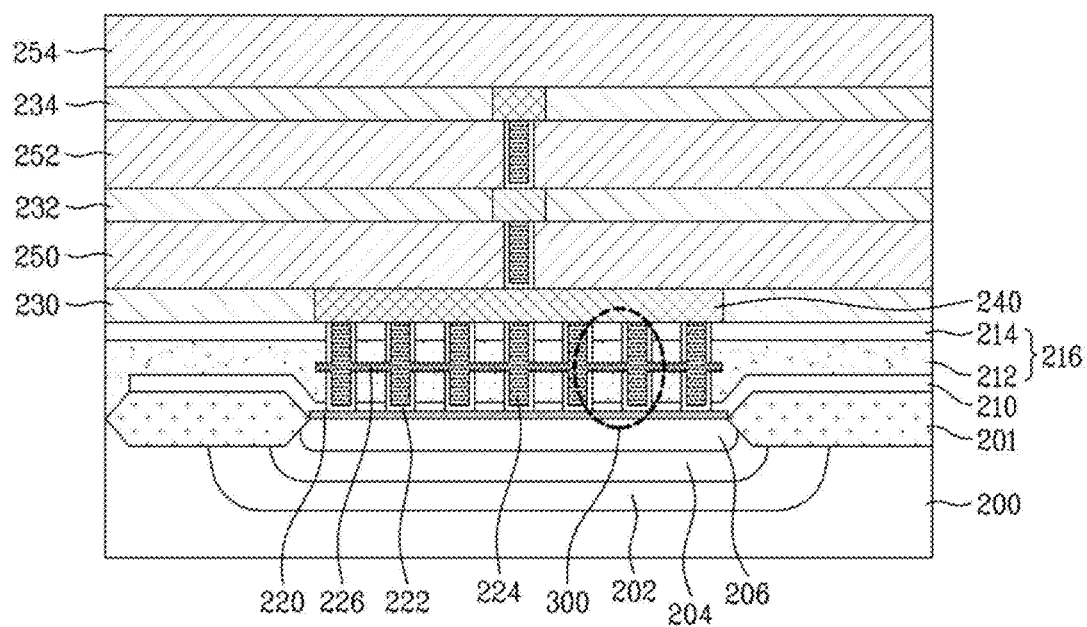
FIG. 4 is a cross-sectional view illustrating a LDMOS transistor according to an exemplary embodiment of the present invention.

FIG. 4 is a cross-sectional view illustrating a LDMOS transistor according to an exemplary embodiment of the present invention. An overhead view of an LDMOS transistor according to the present invention does not differ substantially from an overhead view of a conventional LDMOS transistor, as shown in FIG. 1. Thus, the cross-sectional view of FIG. 4 is a view of an LDMOS transistor according to the present invention, which, from an overhead view, resembles FIG. 1 and, for the sake of illustration, can be visualized as a cross-sectional view along the line B-B' shown in FIG. 1.

Figure 2:
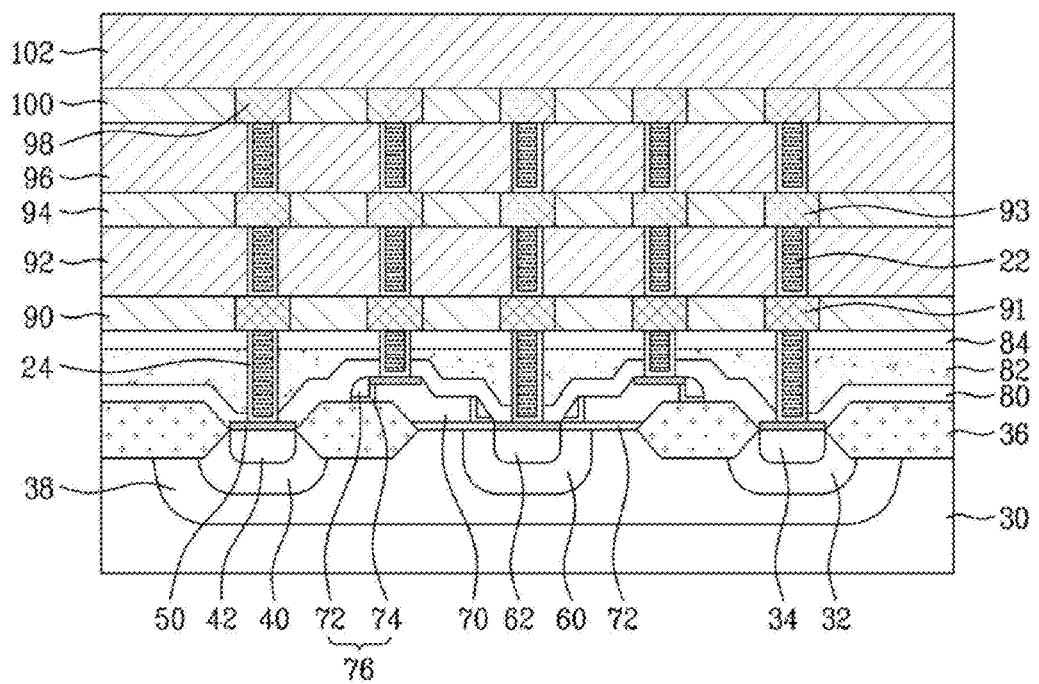
FIG. 2 is a cross-sectional view illustrating the LDMOS transistor cut away along the line A-A' shown in FIG. 1.

A cross-sectional view of the LDMOS transistor according to the exemplary embodiment of the present invention cut away along the A-A' line shown in FIG. 1 is substantially identical to FIG. 2 and a detailed description thereof will be omitted accordingly. To make the present invention understood easily, an n-type LDMOS transistor is described to explain the present invention. However, the present invention is not limited thereto. The technical principles described herein are also applicable to a p-type LDMOS transistor.

In reference to FIG. 4, an n-type well 202 is formed on an n-type substrate 200 (which may be an n-doped single-crystal silicon wafer, or a single-crystal silicon wafer with one or more n-doped layers of epitaxial silicon grown thereon) having an active region defined by an isolation layer 201. A p-type body region 204 is formed in the n-type well 202. The n-type well 202 and the p-type body region 204 may be formed by conventional masking and implantation techniques. For example, a first photoresist mask (e.g., a negative or a positive photoresist; not shown) defining an n-type well region may be formed over the n-type substrate 200. N-type ions (e.g., phosphorus [P], arsenic [As], or antimony [Sb]) are then implanted into the n-type substrate 200 using the first photoresist layer as a mask to form the n-type well 202. The first photoresist layer may then be removed by ashing or stripping. A second photoresist layer (e.g., a negative or a positive photoresist; not shown) may then be formed, defining a p-type body region 204 over the n-type substrate 200. P-type ions (e.g., boron [B]) are then implanted into a portion of the n-type well 202 in the n-type substrate 200 using the second photoresist layer as a mask. The second photoresist layer may then be removed by ashing or stripping.

The isolation layer 201 shown in FIG. 4 may be formed by a LOCOS (Local Oxidation of Silicon) process or it may be formed by an STI (Shallow Trench Isolation) process. In embodiments where the isolation layer 201 is formed by an STI process, the isolation layer may comprise silicon dioxide formed by chemical vapor deposition [CVD] of TEOS or using silane (e.g., $SiH_4$) as a silicon source and dioxygen ($O_2$) and/or ozone ($O_3$) as an oxygen source.

Subsequently, an $n^+$-type source region 206 is formed in the substrate 200. In one embodiment, n-type ions (e.g., phosphorus [P], arsenic [As], or antimony [Sb]) may be implanted into a portion of the p-type body region 204 in the n-type substrate 200 using a transistor gate and a sidewall spacer of a transistor gate (as described above with regard to the conventional LDMOS transistor shown in FIG. 2, see LDMOS gate conductor layer 70 and spacer 76) as a mask. In another embodiment, third photoresist layer defining $n^+$-type source region 206 may be formed over the substrate 200 as a mask prior to implanting n-type ions to form $n^+$-type source region 206.

A silicide layer 220 is then formed in contact regions for forming a contact between the source region 206 and a contact plug 224. The silicide layer may be formed by depositing a metal (e.g., tantalum [Ta], cobalt [Co], nickel [Ni], and/or titanium [Ti]) and annealing (e.g., by rapid thermal annealing at a temperature of about 600 to 1200° C.) the metal to form the silicide layer 220. Unreacted metal on structures other than exposed silicon can then be selectively removed, as is known in the art.

Dielectric layers 210, 216, 230, 250, 232, 252, 234 and 254 are subsequently formed over the substrate 200, including in the active region defined by the isolation layer 201. A plurality of contact plugs 224 may be formed in contact holes formed in these dielectric layers. The dielectric layers 210 and 216 (which may comprise multiple layers, for instance, dielectric layers 212 and 214 as shown in FIG. 4) can be characterized as interlayer dielectric layers (ILD; though they are not limited to such a characterization) and the dielectric layers 230, 250, 232, 252, 234 and 254 can be characterized as Inter Metal Dielectric layers (IMD; though they are not limited to such a characterization).

The dielectric layers 250, 252 and 254 shown in FIG. may be formed chemical vapor deposition [CVD] of Tetra Ethyl Ortho Silicate (TEOS), CVD of silane (e.g., $SiH_4$) as a silicon source and dioxygen ($O_2$) and/or ozone ($O_3$) as an oxygen source, or from spin-on-glass (SOG).

Each of the contact plugs is in contact with each corresponding metal layer 240. A contact barrier layer 222 is formed on an outer surface of the contact plug 224. The contact barrier layer 222 may be formed of TiN or Ti.

A first dielectric layer 210 is formed on or over the substrate 200, including the silicide layer 220. For example, the first dielectric layer 210 may be $SiO_2$ formed by chemical vapor deposition [CVD] of TEOS, CVD of silane (e.g., $SiH_4$) as a silicon source and dioxygen ($O_2$) and/or ozone ($O_3$) as an oxygen source, or from spin-on-glass (SOG).

A second dielectric layer 216 is formed on or over the first dielectric layer 210. The second dielectric layer 216 may be a single layer or a plurality of layers (e.g., layers 212 and 214), as shown in FIG. 4. In exemplary embodiments, the second dielectric layer 216 may comprise one or more layers of Phosphosilicate Glass (PSG) and/or Borophosphosilicate Glass (BPSG). Dielectric layer 212 may itself be a plurality of dielectric layers, as described below in reference to FIGS. 5A-5F, comprising doped dielectric layers (e.g., BPSG and/or PSG). Dielectric layer 214 may comprise one or more undoped dielectric layers (e.g., undoped silicate glass [USG], tetraethyl orthosilicate [TEOS], or silicon nitride). The BPSG and/or PSG may be formed by CVD (e.g., low pressure CVD [LPCVD], atmospheric pressure CVD [APCVD], high pressure CVD [HPCVD], plasma enhanced CVD [PECVD], etc.).

The plurality of contact plugs 224 are spaced apart by a predetermined distance from each other, passing through the first and second dielectric layers 210 and 216. The contact plugs 224 may comprise tungsten, or alternatively aluminum. The tungsten or aluminum may be deposited by CVD (e.g., LPCVD, HPCVD, PECVD, etc.), physical vapor deposition [PVD] (e.g., sputtering).

Figure 3:
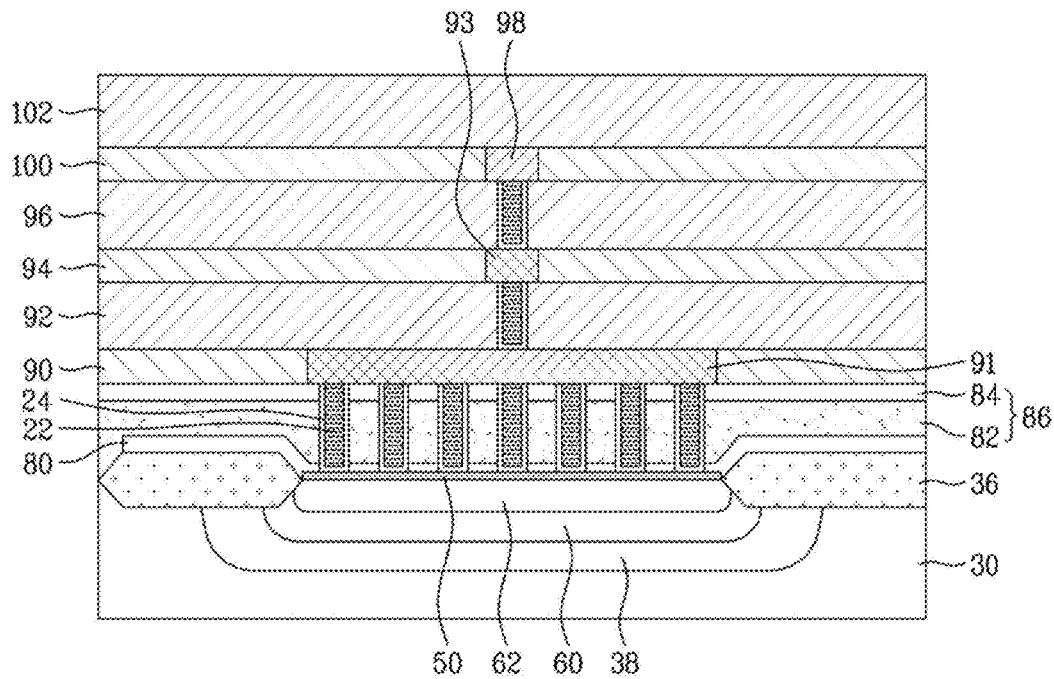
FIG. 3 is a cross-sectional view illustrating the LDMOS transistor of FIG. 1 cut away along the line B-B' shown in FIG. 1.

In contrast to the conventional LDMOS transistor shown in FIG. 3, the LDMOS transistor according to the exemplary embodiment of the present invention includes a bridge metal line 226. The bridge metal line 226 is formed in the second dielectric layer 216, passing through the second dielectric layers 216 (e.g., horizontally) and electrically connecting the plurality of the spaced contact plugs 224. In contrast to the conventional LDMOS transistor shown in FIG. 3, the LDMOS transistor according to the present invention may flow more current through the plurality of contact plugs 224 to an n-type source (e.g., n-type source 206) than a similar conventional LDMOS transistor because of the presence of the bridge metal line 226.

Figure 5A:
FIGS. 5A to 5F are cross-sectional views illustrating a method for manufacturing an LDMOS device according to an exemplary embodiment of the present invention.
Figure 5B:
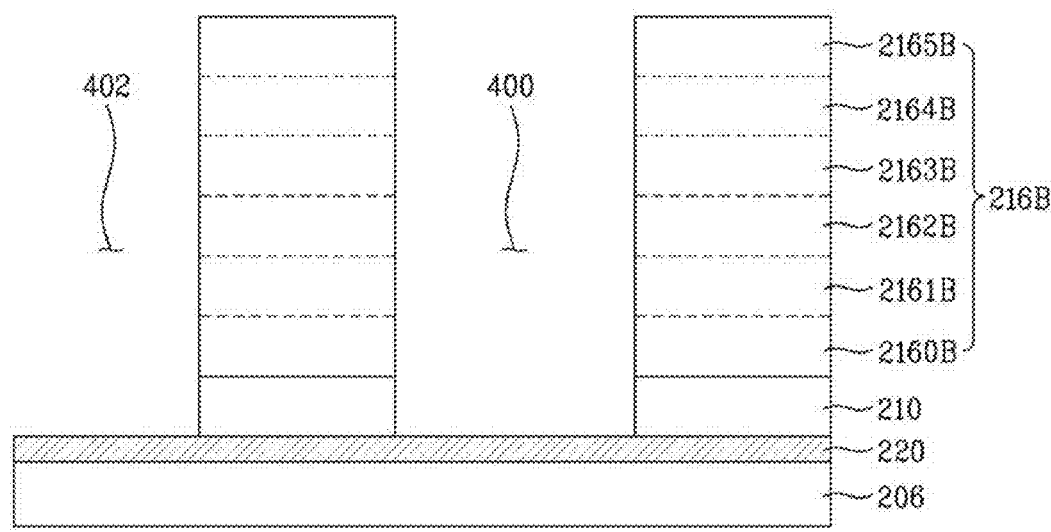
Figure 5C:
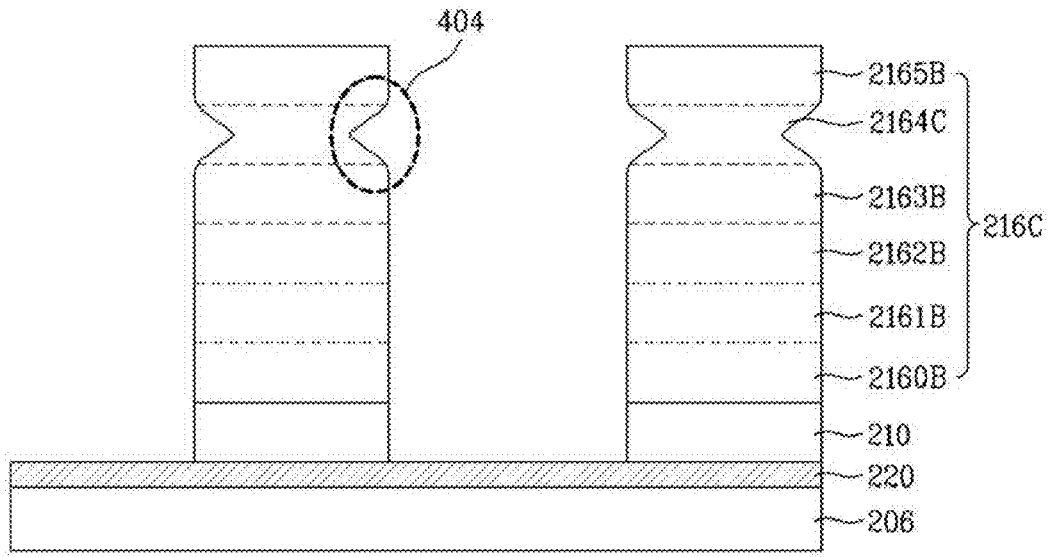
Figure 5D:
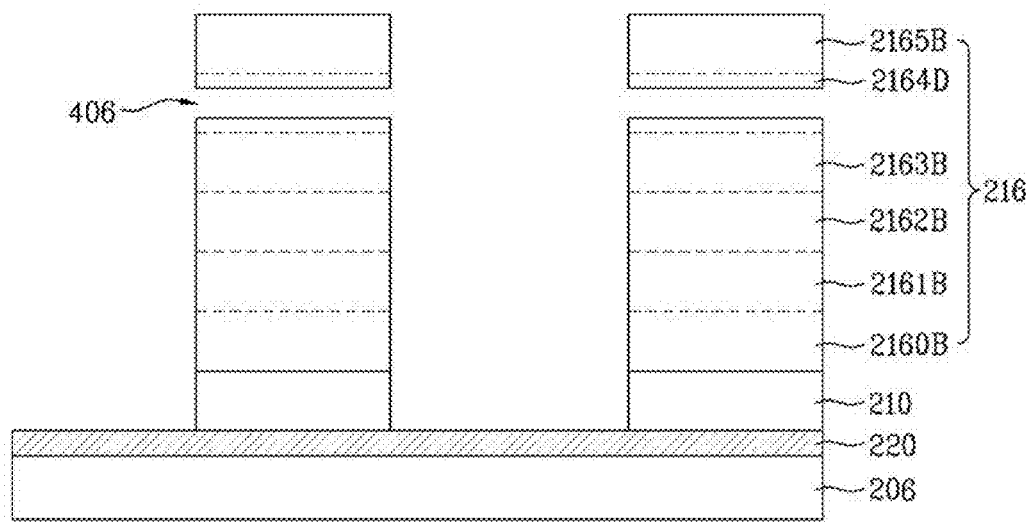
Figure 5E:
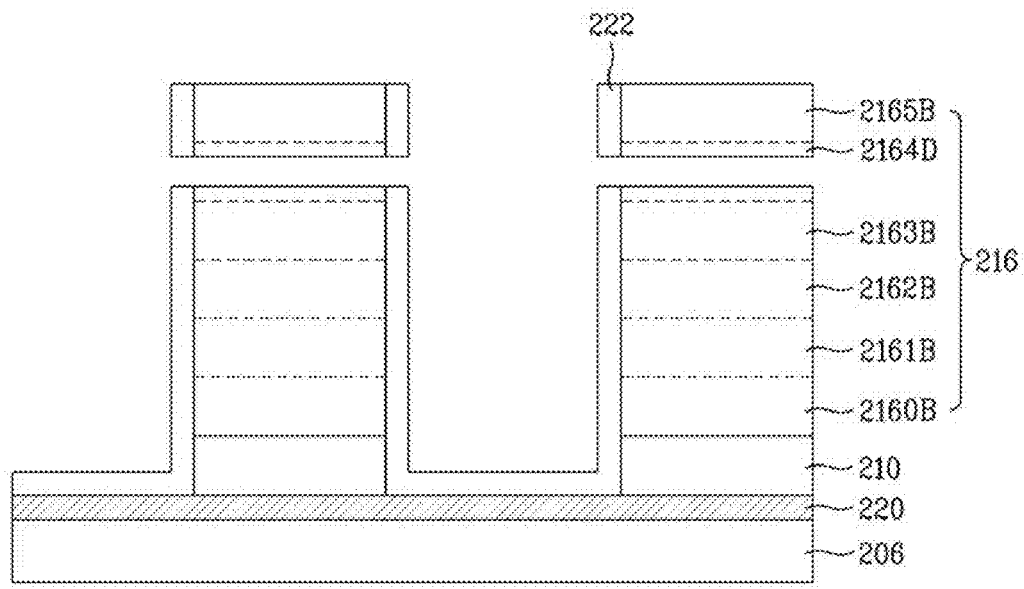
Figure 5F:
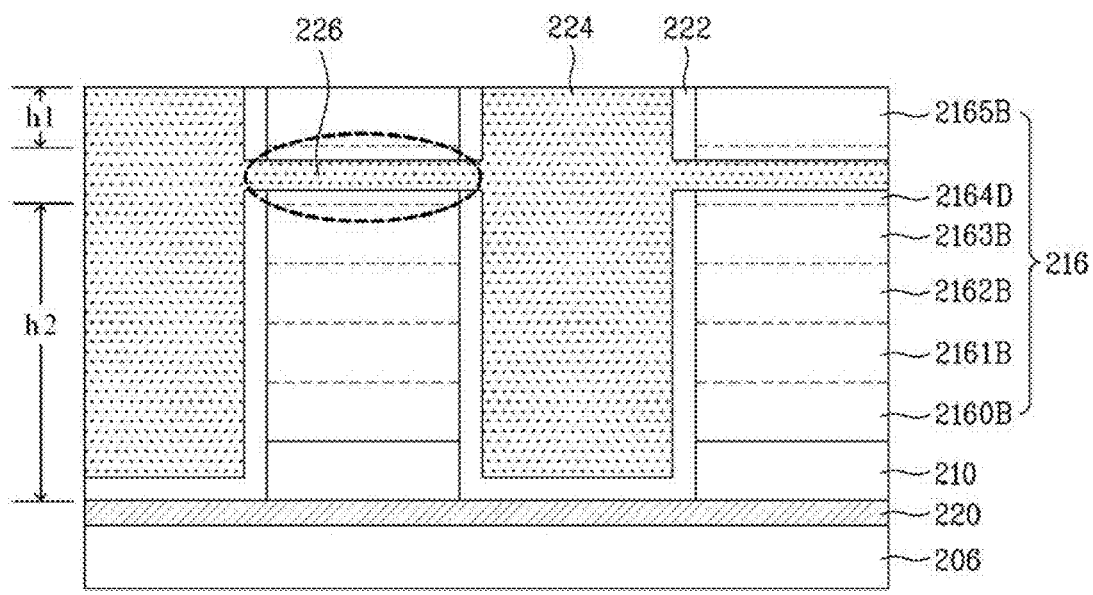

According to the present invention and as shown in FIG. 5f, the ratio of the thickness (h1) of the portion of the second dielectric layers 216 situated over the bridge metal line 226 to the thickness (h2) of the portion of the second dielectric layers 216 and dielectric layer 210 situated under the bridge metal line 226 may be 3:5 to 1:3 (e.g., 3:7).

Prior to forming the plurality of contacts 224, contact holes must be formed in the dielectric layers 210 and 216. Also, a contact barrier layer 222 is formed in the contact holes prior to forming the plurality of contacts 224. Thus, the contact barrier layer 222 is positioned between each of the contact plugs 224 and the second dielectric layers 216, between each of the contact plugs 224 and the first dielectric layer 210, and between the contact plugs 224 and the silicide layer 220.

As follows, a method for manufacturing the above LDMOS transistor according to an exemplary embodiment of the present invention will be described in reference to corresponding drawings. According to the method for manufacturing the LDMOS transistor, only a method for forming the first and second dielectric layers over the substrate 200 (specifically, n-type source region 206) and the bridge metal line 226 are described below. Methods for forming the other elements are described above, and are similar to conventional methods.

FIGS. 5A to 5F are cross-sectional views illustrating a method for manufacturing the LDMOS transistor according to exemplary embodiments of the present invention. FIGS. 5A to 5F illustrate a method for forming an area of an LDMOS transistor over the substrate 200, including an n-type source region 206, as shown in FIG. 4.

As shown in FIG. 5A, the first dielectric layer 210A is formed on or over an upper surface of the silicide layer 220 formed on the n-type source region 206. Here, the first dielectric layer 210A may be characterized as a Pre-metal Dielectric (PMD) or an ILD (although it is not limited to such characterizations), and it may comprise $SiO_2$ (e.g., formed by chemical vapor deposition [CVD] of TEOS, CVD of silane [e.g., $SiH_4$] as a silicon source and dioxygen [$O_2$] and/or ozone [$O_3$] as an oxygen source, or from spin-on-glass [SOG]). A plurality of second dielectric layers 216A having different etch rates may be sequentially formed in a multi-layered plurality of dielectric layers 216A (as generally described with regard to layer 212 shown in FIG. 4) on or over an upper surface of the first dielectric layer 210A. Alternatively, the second dielectric layer 216A may comprise only a single dielectric layer (e.g., like dielectric layer 212 shown in FIG. 4). An additional undoped dielectric layer 214 (as described above and shown in FIG. 4) may be formed over the second dielectric layer 216A. Dielectric layer 214 may be formed over dielectric layer 216A prior to etching contact holes for the plurality of contacts 224, or may be formed after the plurality of contacts 224 is formed.

In embodiments including a plurality of second dielectric layers 216A, the second dielectric layers 216A may be formed as follows. In case of FIG. 5A, the second dielectric layer 216A may be formed in six consecutive deposition processes, although the present invention is not limited to six dielectric layers. The deposition process for forming the second dielectric layer 216A may comprise, for example, 1 to 30 separate dielectric deposition steps, or any number of deposition steps in that range.

More specifically, a predetermined number of the second dielectric layers (e.g., dielectric layers 2160A, 2161A, 2162A and 2163A as shown in FIG. 5A) of the plurality of second dielectric layers 216A are sequentially formed on or over the first dielectric layer 210A. Subsequently, a dielectric layer 2164A having the lowest dopant density of the dielectric layers 2160A to 2165A that may be comprised in second dielectric layer 216A is formed over the previously formed dielectric layers 2160A, 2161A, 2162A and 2163A. A dielectric layer 2165A of the plurality of second dielectric layers 216A is formed on or over the dielectric layer 2164A. According to the present invention, the ratio of the cumulative thickness of the dielectric layers 2164A and 2165A of the plurality of second dielectric layers 216A to the cumulative thickness of the dielectric layers 2160A, 2161A, 2162A and 2163A may be 3:5 to 1:3 (e.g., 3:7). For example, the cumulative thickness of the dielectric layers 2160A, 2161A, 2162A and 2163A may be about 6000 to 7000 Å. That is, each of the dielectric layers 2160A, 2161A, 2162A and 2163A of the plurality of second dielectric layers 216A has a thickness of about 1500 to 2500 Å. In this case, the thickness of the second dielectric layer 2164A is about 1000 to 2000 Å (e.g., 1500 Å) and the thickness of the dielectric layer 2165A may be 1500~2500 Å. In other embodiments comprising further dielectric layers, the thickness of such layers is generally in the range of about 1000~2500 Å.

As described above, the second dielectric layer 216A may comprise PSG and/or BPSG layers. The higher the concentration P and/or B dopant in a BPSG or PSG layer reduces an etch rate of the layer during an isotropic etch using a basic etchant such as KOH or NaOH, and can prevent penetration of alkali ions ($Na^+$ or $K^+$) into the BPSG or PSG layer during the etch. Thus, contamination of the BPSG and PSG layers is avoided during the isotropic etch. Also, as is known in the art, phosphorous has an excellent capturing function. Additionally, boron adds a flowing characteristic at a high temperature of approximately 800° C., improving a planarization characteristic. The dopant (P or P and B) density of the second dielectric layer 2164A is substantially lower than the dopant densities of the other second dielectric layers 2160A, 2161A, 2162A, 2163A and 2165A. In embodiments where one or more of the second dielectric layers 2160A, 2161A, 2162A, 2163A and/or 2165A comprise BPSG, the density of the boron included in the BPSG may be about 1 to 4 wt. % (e.g., 2 wt. %). In embodiments where one or more of the second dielectric layers 2160A, 2161A, 2162A, 2163A and/or 2165A comprise BPSG or PSG, the density of phosphorous may be about 3 to 7 wt. % (e.g., 5 wt. %). The density of dopant in the dielectric layer 2164A is substantially lower than the dopant densities in dielectric layers 2160A, 2161A, 2162A, 2163A and 2165A. For example, if dielectric layer 2164A comprises BPSG, B may be present in an amount of less than 1 wt. % (e.g., 0.1 wt. % or less). If dielectric layer 2164A comprises BPSG or PSG, P may be present in an amount of less than 2 wt. % (e.g., 0.1 wt. % or less). According to the present invention, a thermal process for forming the plurality of second dielectric layers 216A may be performed at temperatures of 650° C.~750° C., preferably, at 700° C. in an $N_2$ atmosphere.

As mentioned above, BPSG and/or PSG is deposited a predetermined number of times to form the second dielectric layer 216A. Subsequently, the second dielectric layer 216A may be planarized in a chemical mechanical polishing (CMP) process to planarize a top surface of the second dielectric layer 216A.

As shown in FIG. 5B, the first and second dielectric layers 210A and 216A are then etched in the active region of the substrate 200 to open the plurality of contact holes exposing the contact regions 400 and 402 spaced apart by a predetermined distance from each other. For example, a photoresist pattern (not shown) for exposing a predetermined area of the second dielectric layer 2165A and defining the contact regions 400 and 402 is formed on or over the second dielectric layer 216A. The first and second dielectric layers 210 and 216A are then etched using the formed photoresist pattern as etching mask, such that the contact holes exposing the contact regions 400 and 402 may be exposed as shown in FIG. 5B. The first and second dielectric layers 210 and 216A may be anisotropically etched by a dry etching process (e.g., Reactive Ion Etching [RIE]) until the silicide layer 220 is exposed.

As shown in FIGS. 5C and 5D, the open contact region 400 and 402 may be exposed to a cleaning process or an isotropic etch using basic etchant such as KOH or NaOH. After performing a cleaning process that uses the basic etchant at least one time, a bridge metal line region 406 passing (e.g., horizontally) through the etched second dielectric layer 216B between the contact regions 400 and 402 may be formed by isotropically etching dielectric layer 2164B of the plurality of second dielectric layers. As explained above, the dielectric layer 2164B has a substantially lower density of P or P and B dopant ions than the other dielectric layers of the plurality second dielectric layers 216B. Thus, dielectric layer 2164B has a higher etch rate than the other dielectric layers of the plurality of dielectric layers 216B when exposed to a basic etchant (e.g., KOH or NaOH). As a result, the dielectric layer 2164B is removed by the exposure to the basic etchant, and the other dielectric layers of the plurality of dielectric layers 216B remain substantially intact.

In some embodiments, the cleaning process or isotropic etch may be performed two or more times, depending on the density of P or P and B ions in the dielectric layer 2164B, and/or the predetermined distance between the plurality of contacts 224. The first exposure to the etchant may remove residue remaining after etching the anisotropic etch of the first and second dielectric layers 210A and 216A from the open contact regions 400 and 402, and partially etch dielectric layer 250B to remove a portion 404. Subsequently, the open contact regions 400 and 402 are again cleaned or etched and dielectric layer 2164C is further etched, leaving a gap (bridge metal line region 406) passing (e.g., horizontally) through the etched second dielectric layer 216 between the contact regions 400 and 402.

As shown in FIG. 5E, a contact barrier layer 222 is formed on side and lower surfaces of the contact holes and on contact regions 400 and 402 prior to forming the plurality of contacts 224. The contact barrier layer 222 may be formed of TiN or Ti, and may be formed by CVD (e.g., PECVD) or PVD (e.g., sputtering).

A metal for forming a plurality of contacts 224 may then be deposited in the contact holes over contact regions 400 and 402, as shown in FIG. 5F. As shown in FIG. 5D, forming the plurality of contacts 224 includes forming the bridge metal line region 226 passing (e.g., in a horizontal direction) through the bridge metal line region 406a and connecting the plurality of contacts 224 in the contact regions 400 and 402. As mentioned above, the second dielectric layer 2164B has a relatively low density of P or P and B, and has relatively fast etch rate compared with the other dielectric layers 2160B, 2161B, 2162B, 2163B and 2165B. As a result of the cleaning process(es), the second dielectric layer 2164B having the lowest dopant density is removed in a horizontal direction and the bridge metal region 406 may be formed.

As shown in FIG. 5F, a metal is deposited in the open contact regions 400 and 402 to form the plurality of the contact plugs 224 spaced apart by a predetermined distance from each other. For example, the deposited metal may be formed by depositing tungsten. Alternatively, the metal may comprise aluminum. The metal may be deposited by CVD (e.g., PECVD), or PVD (e.g., sputtering). While forming the plurality of contact plugs 224, the metal is deposited in the bridge metal line region 406 and the bridge metal line 226 is formed. As a result, the contact plugs 224 may be interconnected to each other by the bridge metal line 226.

According to the LDMOS transistor and the method for manufacturing the same described above, the bridge metal line is formed to inter-connect the contact plugs. As a result, more current may flow in an LDMOS transistor according to the present invention compared to an identically sized, conventional LDMOS transistor.

It will be apparent to those skilled in the art that various modifications and variations can be made in the present invention without departing from the spirit or scope of the invention. Thus, it is intended that the present invention covers modifications and variations of this invention provided they come within the scope of the appended claims and their equivalents.

What is claimed is:

1. A method for manufacturing a LDMOS transistor comprising:
    forming a first dielectric layer on or over a top surface of a substrate;
    forming a plurality of second dielectric layers having different dopant densities on or over a top surface of the first dielectric layer;
    opening a plurality of contact holes, exposing contact regions spaced apart by a predetermined distance by etching the first and second dielectric layers;
    forming a bridge metal line region in the second dielectric layer having the lowest dopant density, passing through the plurality of second dielectric layers between the contact holes exposing the contact regions in a horizontal direction; and
    forming a plurality of contact plugs and a bridge metal line by depositing metal over the contact regions and in the bridge metal line region.

2. The method of claim 1, further comprising forming a contact barrier layer in the contact regions before depositing the metal.

3. The method of claim 1, wherein the step of forming the plurality of the second dielectric layers comprises:

forming one or more second dielectric layers on the first dielectric layer;

forming the second dielectric layer having the lowest dopant density on the one or more second dielectric layers; and forming one or more additional second dielectric layers on the second dielectric layer having the lowest dopant density.

4. The method of claim 3, wherein a ratio of a thickness of the one or more second dielectric layers to a thickness of the one or more additional second dielectric layers is 5:3 to 3:1.

5. The method of claim 1, wherein the plurality of second dielectric layers comprises one or more BPSG layers.

6. The method of claim 5, wherein the second dielectric layers having the lowest dopant density has a lower density of B and/or P than the other second dielectric layers.

7. The method of claim 1, further comprising thermal-processing of the plurality of second dielectric layers at a temperature of 650° C. to 750° C. in an $N_2$ atmosphere.

8. The method of claim 1, wherein the step of forming the bridge metal line comprises cleaning the contact regions at least one time using a basic etchant.

9. The method of claim 8, wherein the cleaning step comprises:

a first etch of the contact regions after etching the first and second dielectric layers; and a second etching of the contact regions before depositing the metal, wherein the first and second etches form the bridge metal line region.

* * * * *